United States Patent
Sung et al.

(10) Patent No.: US 6,171,927 B1
(45) Date of Patent: Jan. 9, 2001

(54) DEVICE WITH DIFFERENTIAL FIELD ISOLATION THICKNESSES AND RELATED METHODS

(76) Inventors: Kuo-Tung Sung, 1F, Number 34, Lane 376, Section 1, Kuan-Fu Road; Yuru Chu, #4 No. 37 Jian-jong Road 1, both of Hsinchu (TW)

( * ) Notice: Under 35 U.S.C. 154(b), the term of this patent shall be extended for 0 days.

(21) Appl. No.: 09/107,581

(22) Filed: Jun. 8, 1998

(51) Int. Cl.[7] .................................................. H01L 21/76
(52) U.S. Cl. ........................ 438/407; 438/423; 438/432
(58) Field of Search .................................. 438/440, 432, 438/423, 407

(56) References Cited

U.S. PATENT DOCUMENTS 5,308,787   5/1994  Hong et al. ............................ 437/70
5,358,894 * 10/1994  Fazan et al. .......................... 438/440

* cited by examiner

Primary Examiner—John F. Niebling
Assistant Examiner—Walter L. Lindsay, Jr.
(74) Attorney, Agent, or Firm—Townsend and Townsend and Crew, LLP

(57) ABSTRACT

A semiconductor device structure with differential field oxide thicknesses. A single field oxidation step produces a nitrided field oxide region (322) that is thinner than a non-nitrided field oxide region (324). The bird's beak (326) of the nitrided field oxide (322) encroaches less into the active cell region than the bird's beak (328) of the thicker non-nitrided field oxide (324). The differential field oxide thicknesses allow isolation of multi-voltage integrated circuit devices, such as flash memory devices, while increasing available active cell area for a given design rule.

16 Claims, 8 Drawing Sheets

Fig. 5B
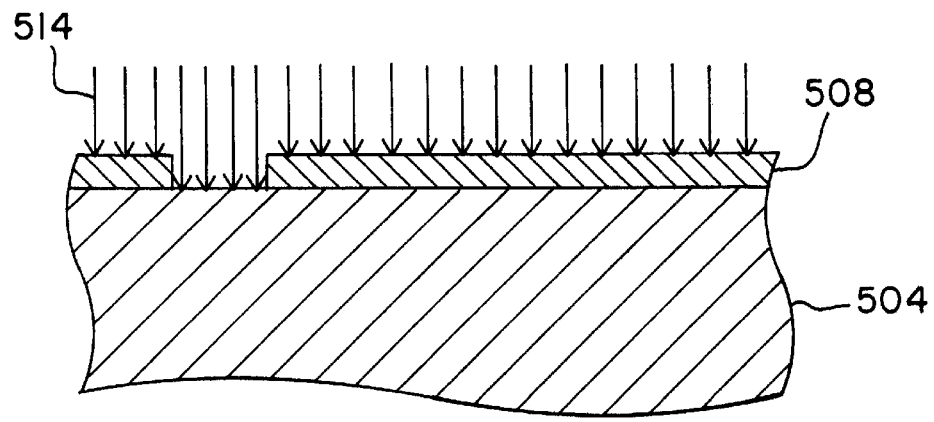
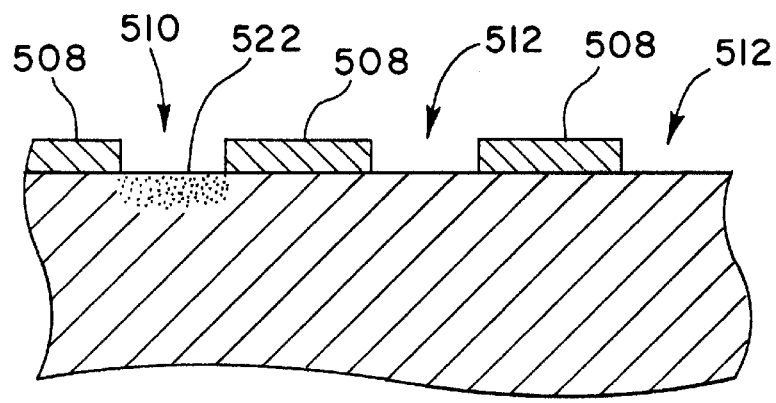
Fig. 5C
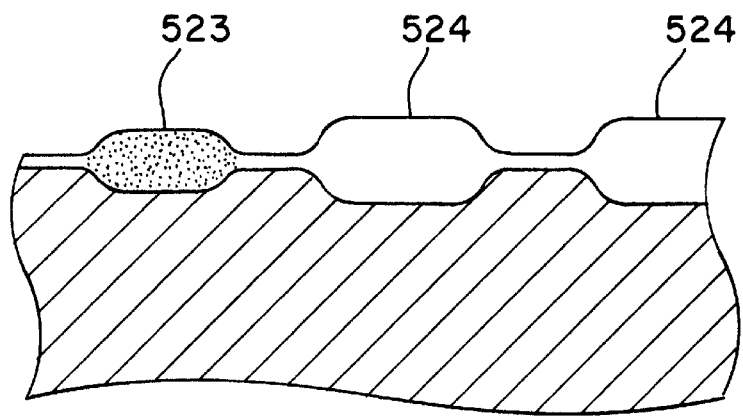
Fig. 5D

DEVICE WITH DIFFERENTIAL FIELD ISOLATION THICKNESSES AND RELATED METHODS

BACKGROUND OF THE INVENTION

The present invention relates to the fabrication of integrated circuit ("IC") devices, and more particularly to non-uniform local oxidation to achieve differential field oxide thicknesses.

Local oxidation of silicon ("LOCOS") is one type of method used to laterally isolate one device on an integrated circuit substrate from another device on the integrated circuit substrate. In a conventional LOCOS process, a layer of patterned silicon nitride is used as a mask in a thermal oxidation process. Even a thin layer of silicon nitride will prevent significant oxidation from occurring beneath it. The patterned silicon nitride layer allows field oxide to grow in the "window" regions while inhibiting oxide growth in the regions covered by silicon nitride. Unfortunately, oxide growth may occur underneath the edge regions of the silicon nitride layer to form what is commonly known as a "bird's beak".

While silicon nitride is effective in preventing oxygen from diffusing through it to the underlying silicon substrate, and hence preventing the formation of an oxide layer, oxygen can still diffuse along the interface between the silicon nitride and the substrate. In some instances, a layer of pad oxide underlies the silicon nitride to reduce stress-related defects in the IC, and this pad layer can also act as a conduit for oxygen. In either instance, a bird's beak may form underneath the silicon nitride layer.

A desirable characteristic of the LOCOS process is that, after the field oxide is formed, the patterned silicon nitride layer can be stripped from the substrate to form what will become active cells between the regions of field oxide. These active cells are self-aligned to the field oxide, thus making efficient use of the valuable substrate area. Unfortunately, a bird's beak intrudes into the active cell region, reducing the area available for active device fabrication. As device geometries continue to shrink, the relative portion of the active cell area consumed by a bird's beak increases, decreasing the ultimate device density of the IC.

Multi-voltage ICs have an additional problem relating to the formation of bird's beaks. Many devices, such as dynamic random-access memories ("DRAMs") and flash electronically erasable, programmable read-only memories ("flash EEPROMs") use more than one voltage during operation. A low voltage may be used for one type of operation, such as a read/write or sense operation, while a higher voltage is used for a word-line boost operation or a floating-gate program/erase operation. ICs with integrated functions, such as memory and data processing functions, may also operate a more than one voltage. It is generally desirable to minimize the cell size, also known as the design rule, to decrease the IC size and hence cost for a given circuit. However, the ability of field oxide to isolate a voltage is generally related to the thickness of the field oxide. Unfortunately, the size of a bird's beak is generally related to the thickness of the field oxide that is grown. Therefore, field oxide that is thick enough to withstand the higher voltage results in an undesirably large bird's beak intruding into the active cell area of the lower voltage devices. Conversely, a field oxide optimized for the design rule of low-voltage cells might not reliably isolate high-voltage cells.

Therefore a multi-voltage IC with field oxidation that reliably isolates high voltages while allowing tighter design rules for low-voltage cells is desirable.

SUMMARY OF THE INVENTION

The present invention provides devices with differential filed oxide thicknesses and methods for making such devices. In one embodiment, a layer of silicon oxide is formed on a surface of a silicon substrate. A silicon nitride layer is formed over the layer of silicon oxide, and the silicon nitride layer is patterned to expose selected regions of the layer of silicon oxide. Selected regions of the exposed silicon oxide are covered with a mask, and the remaining exposed regions of the silicon oxide layer are nitridized by implanting nitrogen into the silicon oxide layer and/or silicon substrate. The mask is stripped and field oxide is grown in the exposed regions of the silicon oxide layer. During the field oxide growth process, the nitridized regions form silicon oxy-nitride, which inhibits oxide growth compared to the non-nitrided regions. After the field oxidation process, the field oxide is thicker in the non-nitrided regions than in the nitrided regions. In a particular embodiment, the non-nitrided field oxide regions are used to isolate an active cell containing a high-voltage memory device of a flash EEPROM memory cell from an active cell containing a low-voltage select transistor, and to isolate high-voltage active cells from each other and from low-voltage cells. The nitrided field oxide is used to isolate active cells containing low-voltage devices from each other. The high voltage is between about 8–9 V, and the low voltage is between about 3–5 V. In another embodiment, the exposed regions of the silicon oxide layer are nitrided by applying a substance that acts as a nitrogen source, such as dilute aqueous ammonia, to the exposed regions.

In another embodiment, the silicon nitride layer is patterned to expose a first set of regions of the silicon oxide layer. The first set of regions are nitrided by thermally treating the layer of silicon oxide in a nitrogen rich environment, such as an environment including ammonia. The silicon nitride layer is then patterned again to expose a second set of regions of the silicon oxide layer. Field oxide is grown in both the nitrided and non-nitrided exposed regions of the silicon oxide layer, the field oxide being thinner in the former than in the latter. In another embodiment, there is no layer of silicon oxide in the windows of the silicon nitride layer and the surface of the silicon substrate is nitrided.

These and other embodiments of the present invention, as well as some of its advantages and features are described in more detail in conjunction with the text below and attached figures.

BRIEF DESCRIPTION OF THE DRAWINGS

FIGS. 5A–5D are simplified cross sections of a portion of an IC as it is processed to produce a differential field oxide thickness according to another embodiment of the present invention;

DESCRIPTION OF THE SPECIFIC EMBODIMENTS

The present invention provides a technique, including methods and devices, for manufacturing an integrated circuit device. In an exemplary embodiment, the present invention provides a technique for isolating active cells, or devices, in a multi-voltage integrated circuit, such as a flash memory device.

Many ICs, such as flash memories and DRAMs, utilize more than one operating voltage. The lower voltage is usually in the range of between about 3–5 V, but could be higher or lower depending on the type and/or size of the basic logic, switching, select, and other devices incorporated in the IC. The lower voltage is often called $V_{DS}$, $V_{CC}$, or the like. A higher voltage is also used for certain operations, such as opening or pumping word lines (e.g. $V_{PP}$ in a DRAM) or programming or erasing flash memory cells (e.g. in a flash memory). The higher voltage may be supplied from an external source, or may be generated internally, that is, generated on the IC chip from the lower voltage. A charge-transfer pump circuit, for example, may be used to generate the higher voltage on the IC chip from the lower voltage. The higher voltage may range from a few volts higher than the lower voltage to more than twice as high as the lower voltage. In a flash memory device, for example, the program/erase voltage may be between about 8–9 volts.

To incorporate such high voltages in an IC, the field oxide thickness has to be sufficiently thick to avoid field turn-on. In a LOCOS or modified LOCOS process, fabricating a thicker field oxide creates a thicker and larger bird's beak region. The larger bird's beak region intrudes further into the active cell area, limiting the cell area available for device fabrication, or more likely, requiring a larger cell area to accommodate the larger bird's beak region.

Figure 1A:
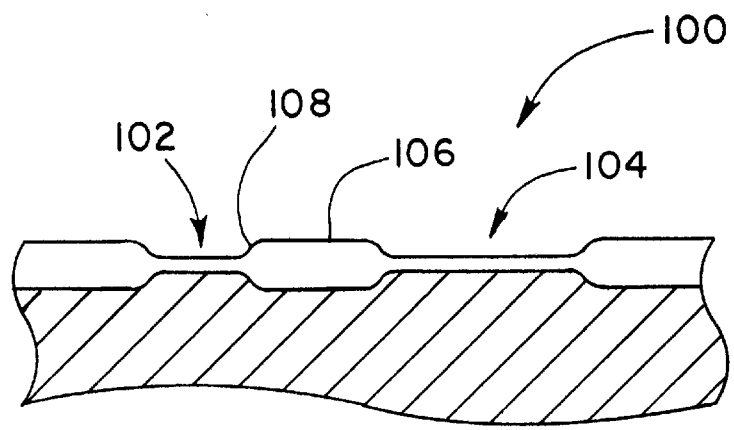
FIGS. 1A–1C are simplified cross sections of portions of an IC illustrating the effect of bird's beak encroachment.
Figure 1B:
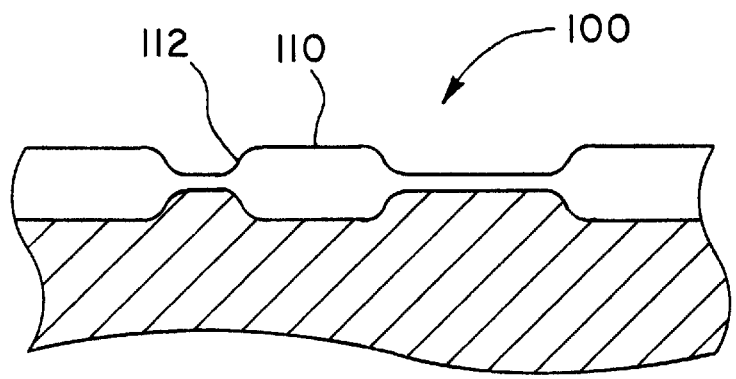
Figure 1C:
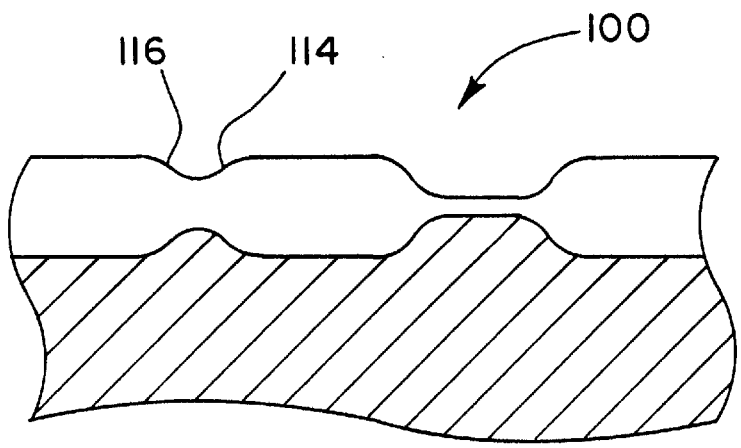

FIGS. 1A–1C are simplified cross sections of portion of an IC 100 where an active cell is isolated from adjacent cells by field oxide. In FIG. 1A, an active cell region for low-voltage devices 102 and an active cell region for high-voltage devices 104 are separated by field oxide 106. The active cells are shown as being different sized solely for purposes of illustration. The field oxide is an appropriate thickness for isolating low voltage cells. This produces a minimal bird's beak 108 and maximizes the active cell area.

In FIG. 1B, the field oxide 110 has been grown to a thickness suitable for isolating high-voltage devices. The bird's beak 112 extends further into the active cell region, reducing the area cell area available for device fabrication. FIG. 1C is an extension of FIG. 1B where the bird's beaks 114, 116 have grown together, thus consuming the entire active cell area.

Figure 2:
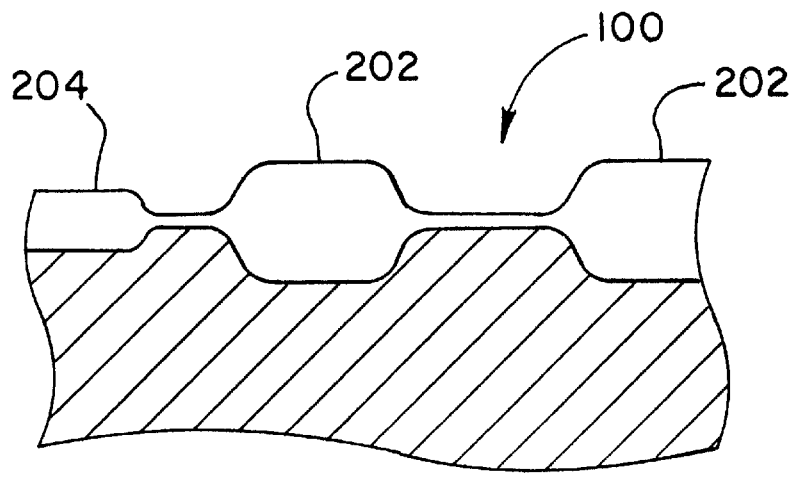
FIG. 2 is a simplified cross section of a portion of an IC with differential field oxide thicknesses according to one embodiment of the present invention.

FIG. 2 is a simplified cross section of a portion of an IC device 100 according to one aspect of the present invention. Field oxide of a first thickness 202 has been grown concurrently with nitrided field oxide of a second thickness 204. The first thickness is greater than the second thickness, providing suitable isolation for high voltages, while resulting in less active cell area lost to bird's beak formation in the low-voltage cells.

Figure 3A:
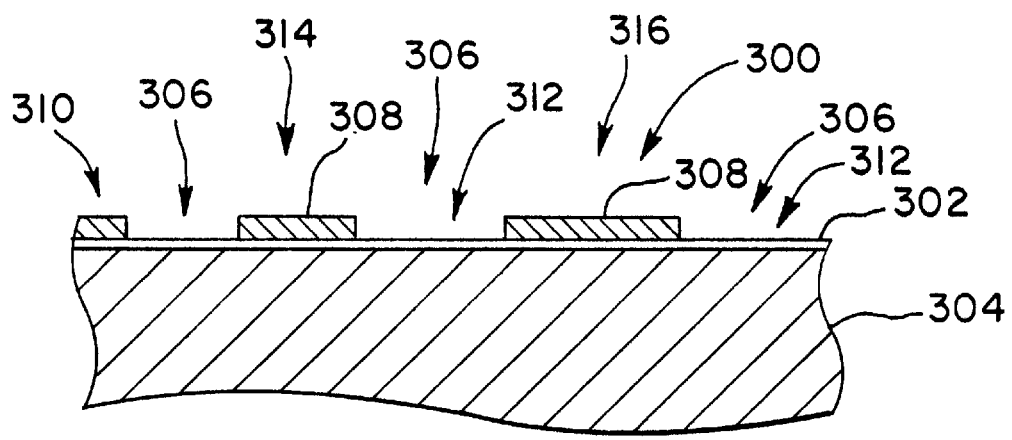
FIGS. 3A–3D are simplified cross sections of a portion of an IC as it is processed to produce a differential field oxide thickness according to another embodiment of the present invention.

FIGS. 3A–3D are simplified cross sections of a portion of an IC device 300 as the device is processed to result in differential thicknesses of field oxide. FIG. 3A shows the portion of the IC with a pad layer of silicon oxide 302 overlying a silicon substrate or silicon film 304. The pad layer is optional, and may be stripped from the windows 306 in the silicon nitride layer 308, or omitted entirely. A layer of silicon nitride 308 has been deposited over the pad layer and patterned by any of several known methods to define field oxide regions 310, 312 and what will become self-aligned low-voltage active cells 314 and high-voltage active cells 316.

Figure 3B:
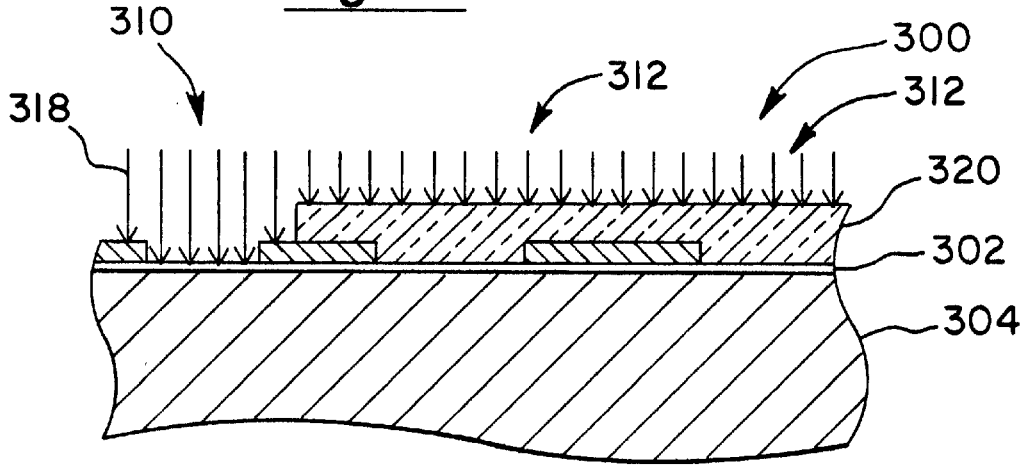

FIG. 3B shows the portion of the IC device 300 after a layer of photoresist 320 has been formed and patterned over the patterned silicon nitride layer 308. The term "photoresist" is used in a generic sense, and is meant to incorporate e-beam resists and similar materials that are used for masking selected areas of a substrate. The patterned photoresist acts as a mask to cover some of the field oxide regions 312, while leaving other field oxide regions 310 exposed. The exposed field oxide regions 310 are nitridized by implanting nitrogen 318 using an ion implantation process. In this instance, $N_2$ was used as precursor in a conventional ion beam implantation process. Other precursors may be used, such as ammonia, or a nitrate or nitrite source, and other implantation processes may by used, such as plasma source ion implantation. The nitrogen may be implanted into the pad layer 302 of silicon oxide or the silicon 304, or both, depending on the implantation energy and temperature of the substrate.

Figure 3C:
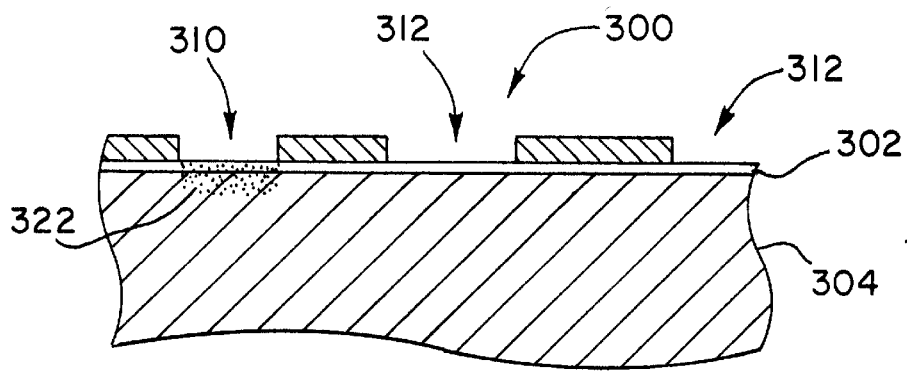
Figure 3D:
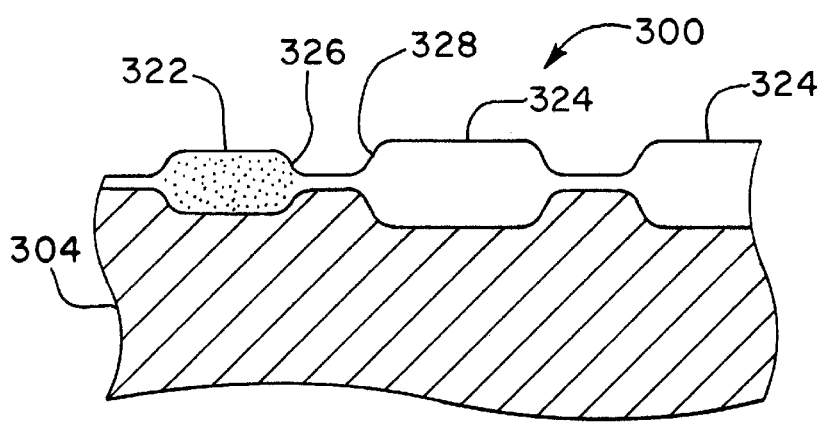

FIG. 3C shows the portion of the IC device 300 after the photo resist has been stripped. The exposed field oxide region 310 has been nitridized, illustrated by a stippled area 322, by the nitrogen implant. The non-exposed field oxide regions 312 have not been nitridized. FIG. 3D shows the portion of the IC device after a single field oxidation step and silicon nitride strip. Thin field oxide has grown in the nitridized areas 322, and thicker field oxide has grown in the non-nitridized areas 324. The thinner field oxide has less of a bird's beak 326 than the bird's beak 328 of the thicker field oxide, resulting in more efficient use of the active cell area.

The thicker field oxide 324 is between about 3,000–8,000 Å thick and the thinner field oxide 322 is between about 1,000–3,000 Å thick. These field oxides form isolation regions of different thicknesses. The isolation regions are used to separate, for example, a high voltage region from a low voltage region. The high voltage region is for a voltage which exceeds, for example, a switching voltage for the low voltage (memory) region. The ratio between this high voltage and the switching voltage ranges from greater than about 1.5, or greater than about 2, or greater than about 3, or greater than about 4.5, or greater than about 6, in embodiments of the present invention, but is not limited to these values. A ratio of the thickness of the thicker field oxide to the thickness of the thinner field oxide ranges from values greater than about 1.5, or greater than about 2, or greater than about 3, or greater than about 4.5, or greater than about 6, in specific embodiments of the invention, but is not limited to these values.

Figure 4A:
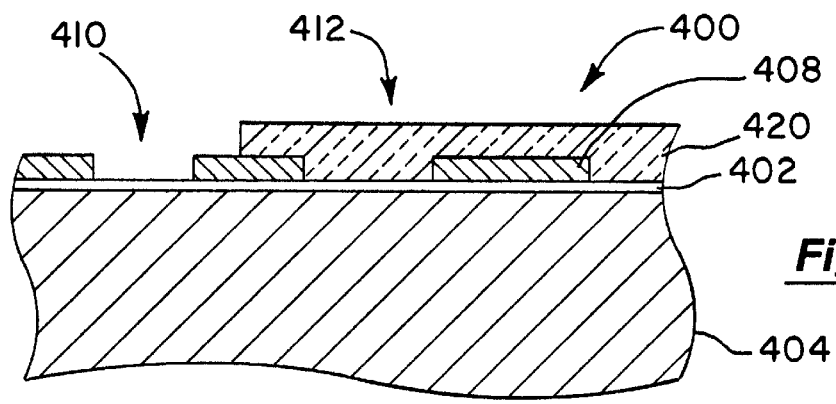
FIGS. 4A–4D are simplified cross sections of a portion of an IC as it is processed to produce a differential field oxide thickness according to another embodiment of the present invention.

FIGS. 4A–4D are simplified cross sections of a portion of an IC device 400 as the device is processed to result in differential thicknesses of field oxide according to another embodiment of the present invention. FIG. 4A shows the portion of the IC device 400 after the silicon nitride oxidation mask layer 408 has been patterned on a silicon film or substrate 404 and a layer of resist 420 has been applied and patterned over the mask layer 408 to cover some of the field oxide areas 412, while leaving the remaining field oxide areas 410 exposed. The photoresist may be the same as, or different than, the photoresist used in the ion-implantation process discussed in conjunction with FIGS. 3A–3D.

Figure 4B:
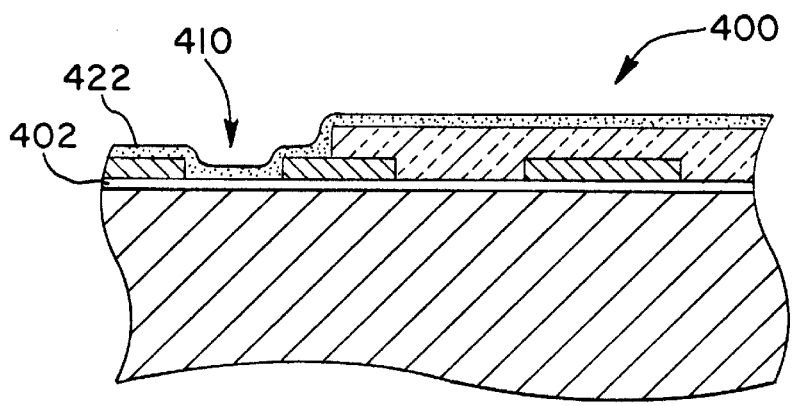

FIG. 4B is a simplified cross section of the portion of the IC device 400 after a nitridizing material has been applied to the exposed portions of the field oxide areas 410. The nitridizing material may be aqueous ammonia or a solution of ammonium nitrate and water, for example. The nitridizing material may be applied by a variety of methods, including spraying, dipping, or spinning. For illustration purposes, a layer of nitridizing material 422 is shown overlying the exposed field oxide areas, but it is understood that the nitridizing material may be bound, absorbed, or otherwise incorporated into the underlying material, which is in this case silicon oxide of the optional pad layer 402, and may be otherwise affixed to the silicon nitride mask and photoresist layers. Although the nitridizing layer 422 is shown as a cohesive layer, it is actually more of a porous residue.

Figure 4C:
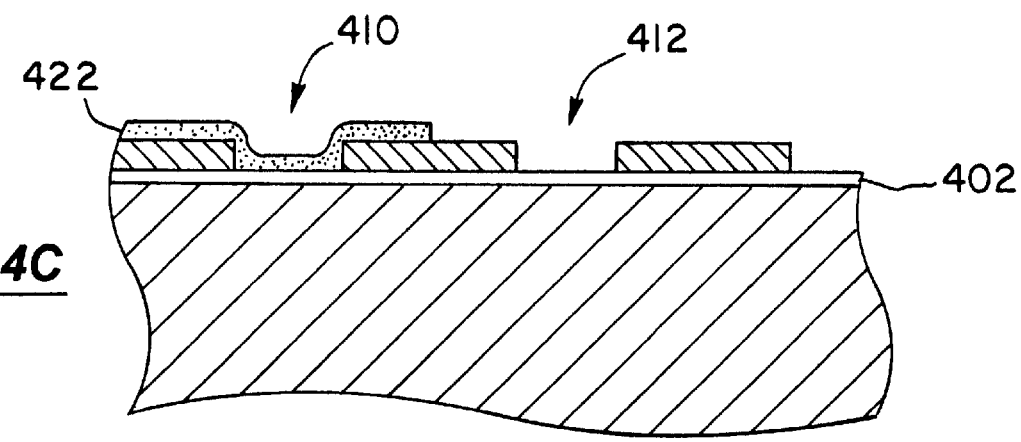
Figure 4D:
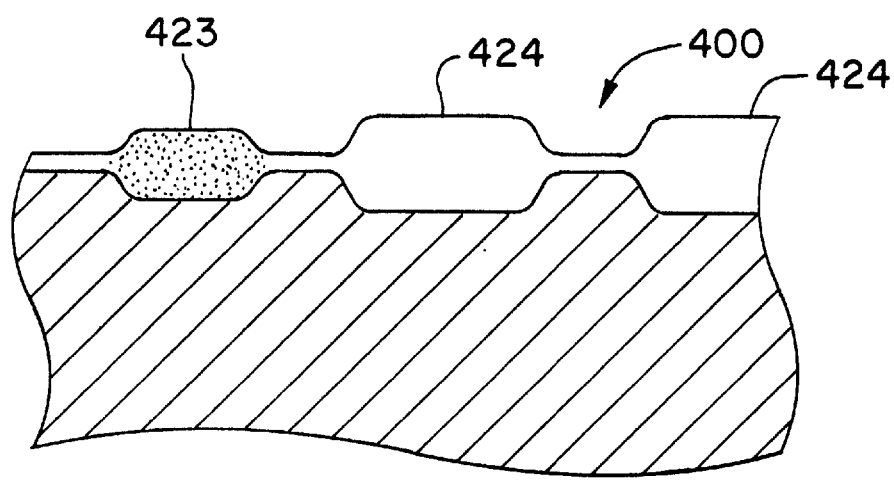

FIG. 4C is simplified cross section of the device after the photoresist has been stripped, exposing the non-nitridized field oxide region 412. An organic solvent was used to strip the photoresist, leaving the nitridizing material 422 in the nitridized field oxide region 410. The organic solvent easily permeates the ionic nitridizing material to dissolve the photoresist and lift off the overlying nitridizing material. FIG. 4D is a simplified cross section of the portion of the IC device 400 after a single field oxide growth step. The field oxide in the nitridized regions 423 is thinner than the field oxide in the non-nitridized regions 424.

Alternatively, a nitridizing material may be deposited as described above or with another process, such as a chemical vapor deposition process. A photolithgraphic process and etch or wash is then used to selectively remove the nitridizing material, leaving it in the windows in the oxidation mask where thin field oxide is desired.

Figure 5A:
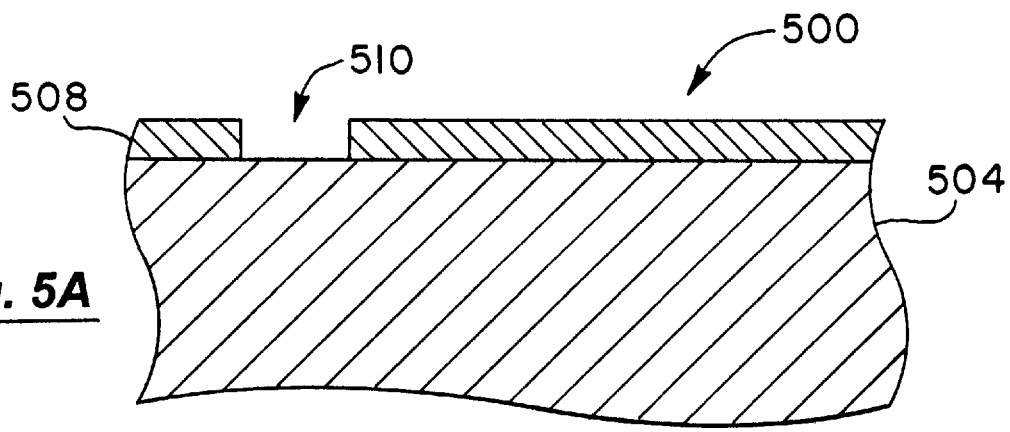

FIGS. 5A–5D are simplified cross sections of a portion of an IC device 500 as the device is processed to result in differential thicknesses of field oxide according to another embodiment of the present invention. FIG. 5A shows a silicon substrate or film 504 with an oxidation mask layer 508, such as silicon nitride layer. As discussed above in conjunction with FIGS. 3A–3D, a pad layer of silicon oxide (not shown in this embodiment) may lie between the oxidation mask layer and the silicon substrate. The oxidation mask layer is patterned using known techniques to form a first pattern, represented by exposed areas of silicon 510.

FIG. 5B shows the exposed areas being nitridized with an ion beam 514 formed from $N_2$. Of course, other methods for nitridizing may be employed, as discussed above. If, for example, a nitridizing material is applied, the material may be driven into the silicon by a thermal treatment, as the oxidizing mask can typically withstand higher temperatures, or a thermal treatment may be performed in a nitridizing atmosphere, such as by heating the substrate in an ammonia-containing atmosphere, with or without oxygen or water vapor (steam).

FIG. 5C shows the portion of the IC after a nitridizing region 522 has been formed and after a second set of field oxide regions 512 has been exposed by a second patterning process of the oxidation mask layer 508. As discussed above, the nitridizing may be incorporated within the substrate material, or may be a region of material lying on the substrate. It is shown as being within the substrate solely for convenience of illustration. FIG. 5D shows the portion of the IC after a single field oxidation process. The field oxide in the nitrided areas 523 is thinner than the field oxide in the non-nitrided areas 524.

Figure 6:
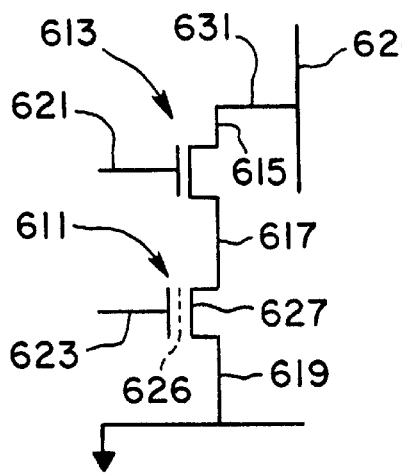
FIG. 6 is a simplified circuit diagram of portion of a flash memory device adaptable for use with the present invention.

FIG. 6 is a schematic circuit diagram of a memory cell according to an embodiment of the present invention. With reference to FIG. 6, a memory cell of the present invention includes a memory device 611 and a field effect transistor 613 which allows selection of memory device 611 from among other memory cells. A drain 615 of selection transistor 613 is connected via a metal contact 631 to a read line 629. Selection transistor 613 and memory device 611 are connected together in series at a node 617 which serves as both a source for selection transistor 613 and a drain for memory device 611. A source 619 of memory device 611 connects to a common source line which in turn is coupled to ground. The gate 621 of selection transistor 613 is electrically connected to a word select line. The control gate 623 of memory device 611 is connected to a sense enable and program line. The circuit of FIG. 6 also includes in the memory device 611 a floating gate 626 separated from the substrate by a gate oxide layer, which is typically very thin, between about 50–300 Å and represented in FIG. 6 by a dashed line 626. A program and erase implant 627 is provided in memory device 627 proximate to the device 617. The gate oxide layer together with the program and erase implant 627 permit rapid erasure of the memory device 611 electrically in a few milliseconds, instead of the usual twenty minutes or so with UV light with prior memory devices. The implant 627 also enables more efficient reprogramming to occur. As will be seen below, the memory cell layout and fabrication process of the present invention provides for a smaller size memory cell and associated isolation region.

Figure 7:
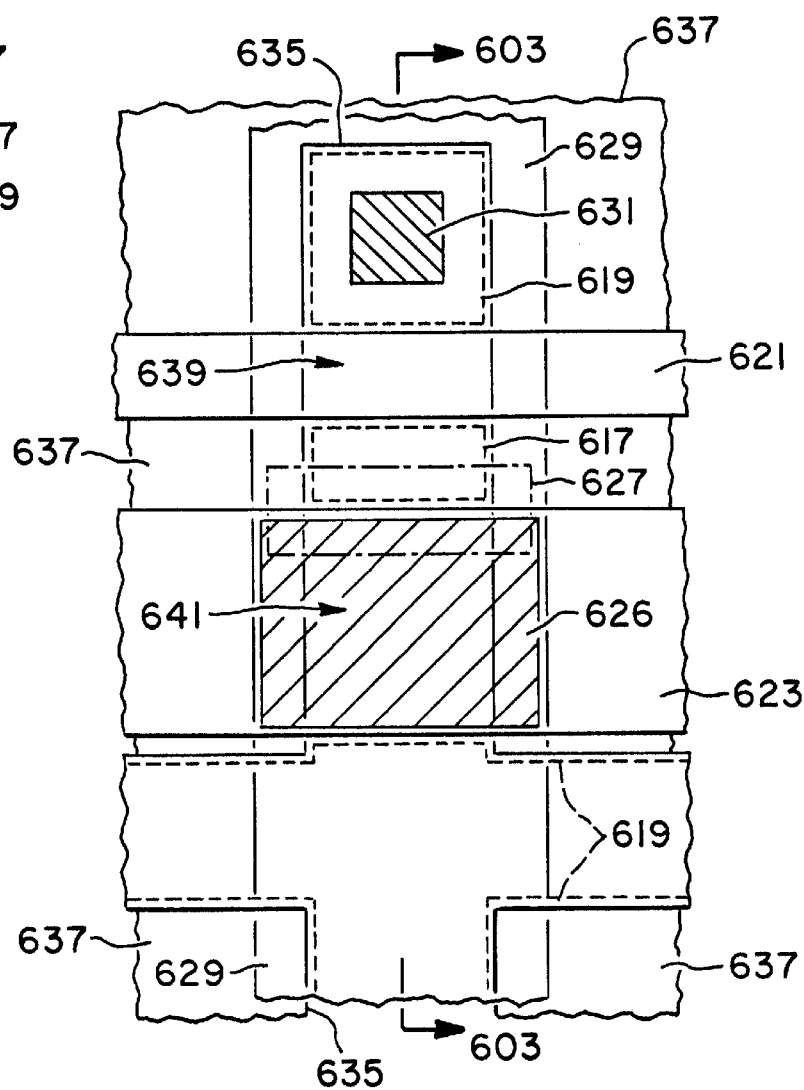
FIG. 7 is a simplified top view of a portion of a flash memory device according to one aspect of the present invention.
Figure 8:
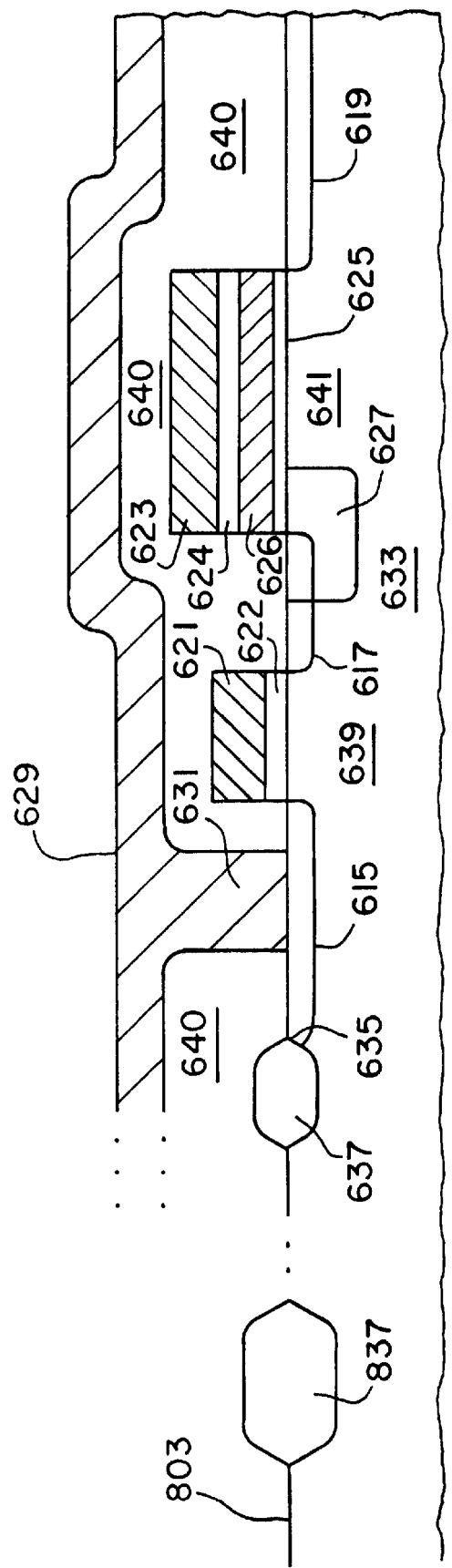
FIG. 8 is a simplified cross section of a flash memory device according to one aspect of the present invention.

FIG. 7 is a top plan view of the memory cell of FIG. 6. FIG. 8 is a side sectional view taken along the line 603—603 in FIG. 7. With reference to FIGS. 7 and 8, a semiconductor chip having an array of memory cells comprises a semiconductor substrate 633 with active memory areas 635 therein. A field isolation oxide layer 637 is present over all nonactive areas outside of memory areas 635. Three spaced-apart implants 615, 617 and 619 are located in memory area 635 with channel areas 639 and 641 defined therebetween. Implant 615 forms a drain for the selection transistor 613 in the circuit of FIG. 6. Implant 617 forms a node functioning as both a source for selection transistor 613 and a drain for memory device 611 in FIG. 6. Implant 619 forms a source for memory device 611. While substrate 633 is typically P-type and implants 615, 617 and 619 are N-type.

A program and erase implant 627 is also present in the active memory area 635 of substrate 633. Implant 627 overlaps part of node implant 617, extending into channel 641 between implants 617 and 619 of the memory device 611. Implant 627 is N-type in this instance, and may be formed by either phosphorus or arsenic ion implantation followed by diffusion, as explained below. A thin oxide layer 625 is disposed over channel 641 between implants 617 and 619, including over the portion of program and erase implant 627 which extends into channel 641, in active area 635. Typically, thin oxide layer 625 is between 70 Angstroms and 150 Angstroms thick. The remainder of active area 635 between field oxide layer 637 has an oxide layer 622 over it. Oxide layer 622 is thicker than thin oxide layer 625, typically about 300–500 Angstroms thick.

A polysilicon floating gate 626 is disposed on thin oxide layer 625 and extends over that portion of program and erase implant 627 that is beneath thin oxide layer 625. An interpoly oxide layer 624 is disposed on floating gate 626 and a polysilicon sense gate 623 is situated above interpoly oxide layer 624. A polysilicon select gate 621 is disposed above channel 637 between implants 615 and 617. The entire wafer is covered with an insulating glass layer 639 with vias for contacts 631 therein. A layer of conductive lines 629 is disposed on top of glass layer 640.

In addition to the field isolation layer 637, there is another field isolation layer 837 that is thicker than the layer 637. The isolation layer 837, isolates a high voltage active region 803. The isolation layer 837 is made, along with at least nearby portions of the isolation layer 637 according to the single oxidation process described above with respect to earlier figures.

Figure 9:
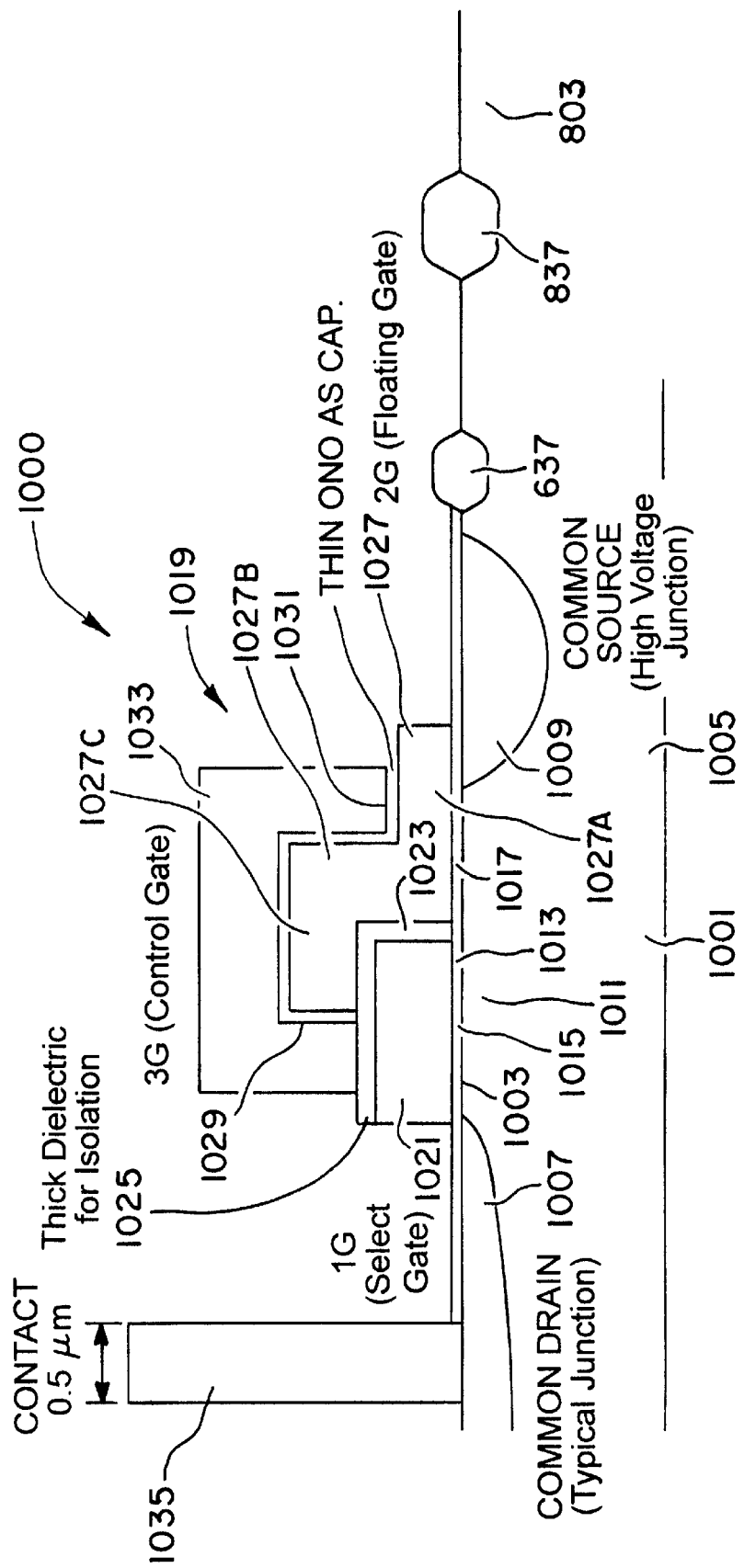
FIG. 9 is a simplified cross section of another flash memory device according to one aspect of the present invention.

In a specific embodiment, the present invention also can be applied to an improved flash memory cell 900, such as the one shown in the simplified diagram of the FIG. 9, for example. This diagram is merely an illustration and should not limit the scope of the claims. One of ordinary skill in the art would recognize other variations, alternatives, and modifications. Memory cell 1000 is defined in substrate 1001, which includes an upper surface 1003 that is substantially planar in geometry. A well region 1005 is defined in the substrate. The well region 1005 has a drain region 1007 and a source region 1009. In some embodiments, the drain region is a common drain region, which is shared by another memory cell. Similarly, the source region can be a common source region, which is shared by another memory cell. Between the source region and the drain region is a channel region 1011. The source and drain regions are made using implantation techniques, but can also be made using plasma immersion ion implantation or the like. A dielectric layer 1013, including a gate dielectric layer 1015 and a tunnel dielectric layer 1017, is defined overlying the channel region 1011. These dielectric layers can be made using a suitable material including silicon dioxide, silicon nitride, silicon oxy-nitride, and others. In the context of this embodiment, the gate dielectric and tunnel dielectric layers are made of high quality silicon dioxide. The tunnel dielectric layer is substantially uniform and substantially pinhole free. Additionally, the tunnel dielectric layer can withstand numerous programming and erase cycles.

The memory cell 1000 also includes a novel gate structure 1019. In particular, the gate structure 1019 includes a select gate 1021, which is defined from a first polysilicon layer, e.g., poly-1. The select gate is made from a polysilicon layer that is doped using N-type impurities. In some embodiments, the impurities are diffused using a $POCl_3$ compound or the like. Alternatively, the gate can be in-situ doped using a phosphorous bearing compound or the like. In further embodiments, the polysilicon layer can be laid in an amorphous state, which is later crystallized. The amorphous state generally produces a smoother polysilicon layer. The select gate overlies gate oxide and extends to the drain region. A sidewall spacer 1023 and an overlying insulating layer 1025 are defined overlying the select gate. The sidewall spacer and the insulating layer insulate and isolate the select gate from overlying circuit elements, e.g, control gate, floating gate. The select gate also has a channel region ranging from about 0.2 micron and less or about 1.0 micron and less, but is not limited to these ranges. Additionally, the select gate has a thickness of about 500 Angstroms and less and about 3500 Angstroms and less, but is not limited to these ranges.

The gate structure 1019 also includes a split floating gate 1027 overlying a portion of the upper surface of the substantially planar substrate, and also overlaps a portion of the select gate, which is defined overlying the planar surface of the substrate. That is, the split floating gate is defined overlying insulating layer 1025, which forms overlying the top surface of the select gate. The split gate also overlies an edge(s) including sidewall spacer 1023 of the select gate.

The split gate 1019 also has an edge 1029 overlying a region on the top surface of the split gate. Split floating gate 1019 also extends from the select gate to a region overlying tunnel dielectric layer 1017 and extends to source region 1009. Accordingly, the split gate has at least three regions, including a lower horizontal region 1027A overlying the planar surface (which includes the tunnel oxide and the source/drain region), a vertical region 1027B overlying an edge or sidewall spacer of the select gate, and an upper horizontal region 1027C overlying the top surface of the select gate. The lower horizontal region 1027A, the vertical region 1027B, and the upper horizontal region 1027C define the split gate structure.

The split gate 1027 can be made of any suitable material such as, for example, polysilicon, e.g., poly-2. In most embodiments, the split gate is made from a polysilicon layer that is doped using N-type impurities. In some embodiments, the impurities are diffused using a $POCl_3$ compound or the like. Alternatively, the floating gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A dielectric layer(s) 1031 is defined overlying the floating gate. The dielectric layer forms along edges of the floating gate, which are over the select gate. Additionally, the dielectric layer overlies the top surface of the upper horizontal region, overlies an outer surface of the vertical region, and extends over the lower horizontal region of the floating gate structure. Of course, the type of dielectric layer used depends highly upon the size and shape of the floating gate and control gate. The dielectric layer 1031 can be any suitable layer or combinations of layers such as an oxide-on-nitride-on-oxide, which is commonly termed "ONO." The dielectric layer can also be a single nitride layer or a single oxide layer depending upon the application. Either CVD or thermal techniques can be used to form the dielectric layer or layers. The dielectric layer insulates and isolates the floating gate from a control gate 1033.

Control gate 1033 forms overlying the dielectric layer 1031, which is sandwiched between the floating gate and the control gate. The control gate is defined overlying edge 1029 of the floating gate, which is over a top portion of the select gate. The control gate also forms overlying the upper horizontal region, the vertical region, and the lower horizontal region of the floating gate. The control gate can be made of any suitable material such as, for example, polysilicon, e.g., poly-3. In most embodiments, the control gate is made from a polysilicon layer that is doped using N-type impurities. In some embodiments, the impurities are diffused using a $POCl_3$ compound or the like. Alternatively, the control gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A contact 1035 is defined overlying the drain region. Contacts are also defined on the select gate, the control gate, and the source region. These contacts can be made using a variety of techniques. For example, the contacts can be made using a combination of metals such as aluminum with a barrier metal such as titanium nitride, titanium tungsten, and others. Alternatively, the contacts can be made using a tungsten layer or copper layer with a barrier metal. Furthermore, the contacts can be made from "plugs" such as tungsten plugs, polysilicon plugs, aluminum plugs, and the like. The plugs can be used with or without a barrier layer, or can also be grown in a selective manner. Of course, the type of contacts used depends highly upon the application.

An isolation region 637 separates isolates the FLASH cell 1000. A second isolation 837, which is thicker than the isolation region 637, isolates a high voltage active region 803. The voltage for the high voltage active region 803 is higher than the voltage for the cell 1000. The isolation regions 637 and 837 are made according to the process described above with respect to earlier figures. It is understood that a high voltage active region may be operated at a lower voltage in some applications, and that such a cell may still have thicker isolation. That is, the thicker oxide provides greater isolation, but may not be necessary, depending on the cell operation condition.

In the present embodiment, the gate coupling ratio ("GCR") is increased by way of the present novel transistor design. GCR increases by increasing the area of the floating gate that is capacitively coupled to the control gate relative to the area of the floating gate that is capacitively coupled to the tunnel oxide overlying the active cell region. As shown, the control gate couples to the floating gate through exposed surfaces of edge 1029, upper horizontal region 1027C, and vertical region 1027B. Floating gate couples to the tunnel oxide through the lower horizontal region 1027A. Accordingly, control gate couples to the floating gate through at least two additional surface regions. Ideally, GCR approaches one in embodiments of the present invention. Practically, however, it is quite difficult for GCR to equal one. Accordingly, GCR ranges from values greater than 0.3, or greater than 0.5, or greater than 0.6, or greater than 0.8 in the embodiments of the present invention, although GCR is not limited to these values. The exact value of GCR depends upon the particular geometric configuration of the floating gate as well as the design rule of the device. Of course, the final GCR value will depend upon the particular application.

In a specific embodiment, the present memory cell can be programed and erased by placing voltages on selected gate structures. To program the floating gate or add electrons to the floating gate, selected voltages are applied to the gate structures and source/drain regions. Electrons migrate from the source region through the channel region and inject through the tunnel oxide layer to the floating gate, where electron charge builds up. To erase the floating gate or remove electrons from the floating gate, selected voltages are applied to the gate structures and the source/drain regions. Electrons migrate from the floating gate through the tunnel oxide layer to the channel region and out through the drain region.

While the above is a complete description of specific embodiments of the present invention, various modifications, variations, and alternatives may be employed. For example, the substrate could be a semiconductor-on-insulator ("SOI") type of wafer, or a wafer other than a silicon wafer. The present invention may be adapted to other types of substrates or devices with appropriate selection of materials and processes, and these and other variations will be apparent to persons of skill in the art. These equivalents and alternatives are intended to be included within the scope of the present invention. Therefore, the scope of this invention should not be limited to the embodiments described, and should instead be defined by the following claims.

What is claimed is:

1. A method for producing an intermediate semi-conductor device structure, the method comprising:
    (a) patterning an oxidation mask layer disposed on a substrate to create a first window region and a second window region, wherein the first and second window regions are generally equal in size;
    (b) forming a layer of resist on the oxidation mask layer;
    (c) patterning the layer of resist to cover the second window region and not the first window region;
    (d) nitridizing the first window region, the second window region remaining non-nitridized;
    (e) stripping the layer of resist from the oxide layer;
    (f) oxidizing the substrate to form a nitridized field oxide in the first window region and a non-nitridized field oxide in the second window region, the nitridized field oxide being thinner than the non-nitridized field oxide, the thinner nitriidized field oxide having less of a bird's beak than the non-nitridized field oxide; and
    (g) stripping the oxidation mask from the substrate.

2. The method of claim 1 wherein said nitridizing is performed by an implantation process.

3. The method of claim 1 wherein said nitridizing is performed by applying a nitrogen source to at least the first window region.

4. The method of claim 1 where said oxidizing the substrate is a single field oxidation step.

5. The method of claim 4 where said oxidizing produces a non-nitridized field oxide thickness of between about 3,000–8,000 Å and a nitridized field oxide thickness of between about 1,000–3,000 Å.

6. The method of claim 5 wherein the non-nitridized field oxide thickness is at least about 1.5 times the nitridized field oxide thickness.

7. A method for producing an intermediate flash memory semi-conductor device structure, the method comprising:
    (a) patterning an oxidation mask layer disposed on a substrate to create a first window region and a second window region, wherein the first and second window regions are Generally equal in size, the first window region adjoining a low-voltage active cell and the second window region adjoining a high voltage active cell;
    (b) forming a layer of resist on the oxidation mask layer;
    (c) patterning the layer of resist to cover the second window region and not the first window region;
    (d) implanting nitrogen to nitridize the first window region, the second window region remaining non-nitridized;
    (e) stripping the layer of resist from the oxide layer;
    (f) oxidizing the substrate to form a nitridized field oxide in the first window region and a non-nitridized field oxide in the second window region, the nitridized field oxide being at least about 20% thinner than the non-nitridized field oxide, the thinner nitridized field oxide having less of a bird's beak than the non-nitridized field oxide; and
    (g) stripping the oxidation mask from the substrate.

8. A method for producing an intermediate semi-conductor device structure, the method comprising:
    (a) patterning an oxidation mask layer disposed on a substrate to create a first window region;

(b) nitridizing at least the first window region;

(c) patterning the oxidation mask layer to create a second window region, the first and second window regions generally equal in size;

(d) oxidizing the substrate to form a nitridized field oxide in the first window region and a non-nitridized field oxide in the second window region, the non-nitridized field oxide being at least about 1.5 times thicker than the nitridized field oxide, the nitridized field oxide having less of a bird's beak than the non-nitridized field oxide; and (e) stripping the oxidation mask from the substrate.

9. The method of claim 8 wherein said nitridizing is performed by an implantation process.

10. The method of claim 8 wherein said nitridizing is performed by applying a nitrogen source to at least the first window region.

11. A method for producing an intermediate semi-conductor device structure, the method comprising:

forming a pad layer of silicon oxide on a substrate;

patterning an oxidation mask layer disposed on the pad layer to create a first window region and a second window region, the first window region adjoining a low-voltage active cell and the second window region adjoining a high voltage active cell;

forming a layer of resist on the oxidation mask layer, patterning the layer of resist to cover the second window region and not the first window region;

implanting nitrogen into at least the pad layer of the first window region to nitridize the first window region, the second window region remaining non-nitridized;

stripping the layer of resist from the oxide layer;

oxidizing the substrate to form a nitridized field oxide in the first window region and a non-nitridized field oxide in the second window region, the nitridized field oxide being thinner than the non-nitridized field oxide, the thinner nitridized field oxide having less of a bird's beak than the non-nitridized field oxide; and stripping the oxidation mask from the substrate.

12. The method of claim 11, wherein said implanting further comprises implanting the nitrogen into the substrate.

13. A method for producing an intermediate flash memory semi-conductor device structure, the method comprising:

forming a pad layer of silicon oxide on a substrate;

patterning an oxidation mask layer disposed on the pad layer to create a first window region and a second window region, the first window region adjoining a low-voltage active cell and the second window region adjoining a high voltage active cell;

forming a layer of resist on the oxidation mask layer;

patterning the layer of resist to cover the second window region and not the first window region;

applying nitridizing material to at least the pad layer to nitridize the first window region, the second window region remaining non-nitridized;

stripping the layer of resist from the oxide layer;

oxidizing the substrate to form a nitridized field oxide in the first window region and a non-nitridized field oxide in the second window region, the nitridized field oxide being thinner than the non-nitridized field oxide, the thinner nitridized field oxide having less of a bird's beak than the non-nitridized field oxide; and stripping the oxidation mask from the substrate.

14. The method of claim 13 wherein said stripping the layer of resist is performed by using an organic solvent, wherein the nitridizing material remains in the first window region.

15. The method of claim 13 wherein said applying nitridizing material further comprises driving the nitridizing material into the substrate by a thermal treatment.

16. The method of claim 15 wherein said applying nitridizing material further comprises performing the thermal treatment in a nitridizing atmosphere.

* * * * *